(12) United States Patent
Lu et al.

(10) Patent No.: US 10,134,645 B2
(45) Date of Patent: Nov. 20, 2018

(54) STRESS MONITORING DEVICE AND METHOD OF MANUFACTURING THE SAME

(71) Applicant: TAIWAN SEMICONDUCTOR MANUFACTURING COMPANY LTD., Hsinchu (TW)

(72) Inventors: Chen-Fa Lu, Kaohsiung (TW); Cheng-Yuan Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/472,776

(22) Filed: Mar. 29, 2017

(65) Prior Publication Data
US 2018/0286769 A1 Oct. 4, 2018

(51) Int. Cl.
| | |
|---|---|
| *H01L 29/00* | (2006.01) |
| *H01L 21/66* | (2006.01) |
| *H01L 21/3065* | (2006.01) |
| *H01J 49/00* | (2006.01) |
| *H01L 41/09* | (2006.01) |

(52) U.S. Cl.
CPC .......... *H01L 22/30* (2013.01); *H01J 49/0018* (2013.01); *H01L 21/3065* (2013.01); *H01L 22/12* (2013.01); *H01L 41/0926* (2013.01); *H01L 2924/1461* (2013.01)

(58) Field of Classification Search
CPC ............. H01L 22/12; H01L 2924/1461; H01L 41/0926; H01J 49/0018
See application file for complete search history.

(56) References Cited

U.S. PATENT DOCUMENTS

| | | | | |
|---|---|---|---|---|
| 6,422,077 B1 * | 7/2002 | Krauss | ..................... | G01D 5/30 73/105 |
| 2006/0186874 A1 * | 8/2006 | Mackin | ..................... | G01N 3/42 324/754.1 |
| 2006/0289954 A1 * | 12/2006 | Bar-Sadeh | ............. | B82Y 10/00 257/415 |
| 2007/0177129 A1 * | 8/2007 | Kothari | ................. | G01L 5/0047 356/32 |
| 2008/0237755 A1 * | 10/2008 | Chou | ..................... | B82Y 10/00 257/415 |
| 2010/0308690 A1 * | 12/2010 | Currano | ............. | H01L 41/0933 310/333 |
| 2012/0218559 A1 * | 8/2012 | Dell | ..................... | G01N 29/036 356/480 |
| 2014/0139843 A1 * | 5/2014 | Dell | ................... | G01N 29/2418 356/478 |

(Continued)

*Primary Examiner* — Ngan Ngo
(74) *Attorney, Agent, or Firm* — WPAT, P.C., Intellectual Property Attorneys; Anthony King

(57) ABSTRACT

A stress monitoring device includes an anchor structure, a freestanding structure and a Vernier structure. The anchor structure is over a substrate. The freestanding structure is over the substrate, wherein the freestanding structure is connected to the anchor structure and includes a free end suspended from the substrate. The Vernier structure is over the substrate and adjacent to the free end of the freestanding structure, wherein the Vernier structure comprises scales configured to measure a displacement of the free end of the freestanding structure.

20 Claims, 14 Drawing Sheets

(56) References Cited

U.S. PATENT DOCUMENTS

| | | | |
|---|---|---|---|
| 2014/0368829 A1* | 12/2014 | Dell | G01N 21/7746 |
| | | | 356/480 |
| 2015/0263268 A1* | 9/2015 | Fox | H01L 43/08 |
| | | | 257/421 |
| 2016/0101974 A1* | 4/2016 | Sumant | B81B 3/0024 |
| | | | 257/467 |
| 2016/0276014 A1* | 9/2016 | Fox | G11C 11/221 |
| 2017/0084815 A1* | 3/2017 | Choo | H02N 2/181 |
| 2017/0148690 A1* | 5/2017 | Broadway | H01L 22/12 |
| 2017/0363486 A1* | 12/2017 | Okulov | G01L 1/005 |

\* cited by examiner

STRESS MONITORING DEVICE AND METHOD OF MANUFACTURING THE SAME

BACKGROUND

Stress issue is critical to integrated circuit fabrication. High film stress would cause wafer warpage, and even cause wafer crack during fabrication. Conventional film stress measuring methodology is only applicable for bulk materials, but cannot be used to measure local film stress change after post heat treatment or after the film is patterned.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
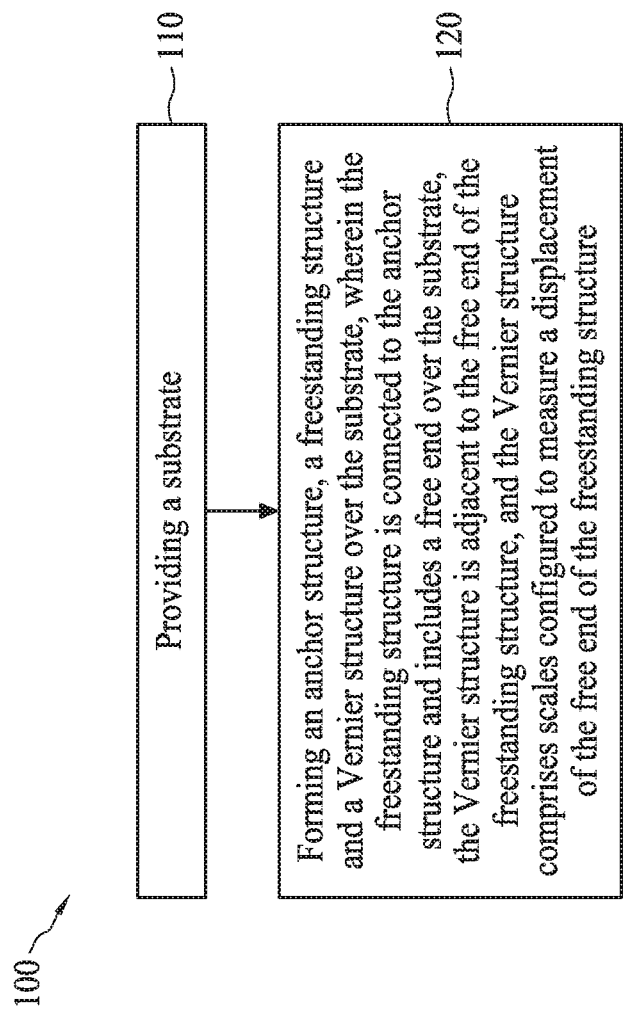
FIG. 1 is a flow chart illustrating a method for manufacturing a stress monitoring device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±20, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the term "anchor" or "anchor structure" refers to a structure that is substantially immobile with respect to a substrate. The anchor or anchor structure may be formed directly or indirectly on the substrate, or may be a part of the substrate.

As used herein, the term "freestanding structure" is a structure that is connected to the anchor at one or more ends, and suspended from the substrate at least during fabrication. In some embodiments, the freestanding structure may be temporarily movable with respect to the substrate. For example, the freestanding structure is a beam structure including a free end mobile with respect to a Vernier structure to detect stress deviation. In some embodiments, the freestanding structure is immobile with respect to the Vernier structure after stress deviation information is obtained. In some embodiments, the freestanding structure is immobile with respect to the Vernier structure when one or more overlying is formed the freestanding structure.

As used herein, the term "Vernier structure" is a structure that is substantially immobile with respect to a substrate. In some embodiments, the Vernier structure is configured as a reference to measure a displacement of the freestanding structure.

In one or more embodiments of the present disclosure, a monitoring device such as a stress monitoring device includes an anchor structure, a freestanding structure and a Vernier structure. The freestanding structure is connected to the anchor structure includes a free end over the substrate. The Vernier structure includes scales to measure a displacement of the free end of the freestanding structure. The free end of the freestanding structure can be driven by stress changes to move relative to the scales of the Vernier, and thus a local stress can be monitored. The stress monitoring device is integratable with fabrication of integrated circuits such as semiconductor devices, MEMS devices, electronic devices or the like. In some embodiments, the stress monitoring device is configured to detect a local stress of a patterned structural layer that forms the freestanding structure and other structures or devices during fabrication. The stress monitoring device is formed from the structural layer, and thus can monitor the stress of the structural layer in real-time. For example, after the structural layer is patterned, or thermally treated, the stress monitoring device is responsive to the stress change as well, and thus can monitor current stress. The stress monitoring device can be formed at any positions of the substrate. In some embodiments, the stress monitoring device can be formed in some or each chip of the substrate to collect stress distribution throughout the substrate, and the stress distribution data can be helpful to modify manufacturing parameters, to alleviate wafer warpage, to avoid peeling or cracking issues, or the like. In some embodiments, the freestanding structure may be covered by at least one overlying layer and constrained by the at least one overlying layer in successive operations after the stress data is obtained. In some embodiments, the freestanding structure includes a test beam, a slope beam and an indicator beam. The test beam is connected to the first anchor at one end. The slope beam is connected to the second anchor at one end, and connected to the test beam at the other end. The indicator beam is connected to the slope beam at one end, and the indicator beam includes the free end pointing at the scales of the Vernier structure and being movable relative to the scales of the Vernier structure. In some embodiments of the present disclosure, a method of manufacturing a stress monitoring device is also provided, as discussed below.

FIG. 1 is a flow chart illustrating a method for manufacturing a stress monitoring device according to various aspects of one or more embodiments of the present disclosure. The method 100 begins with operation 110 in which a substrate is provided. The method proceeds with operation 120 in which an anchor structure, a freestanding structure and a Vernier structure are formed over the substrate. The freestanding structure is connected to the anchor structure and includes a free end over the substrate. The Vernier structure is adjacent to the free end of the freestanding structure. The Vernier structure comprises scales configured to measure a displacement of the free end of the freestanding structure.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
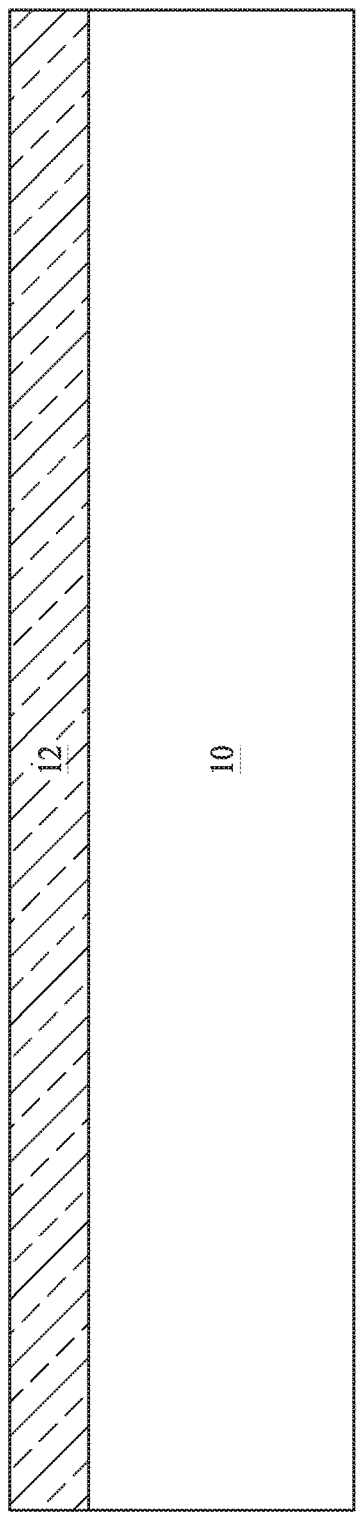
FIG. 2A, FIG. 2B, FIG. 2C, FIG. 2D, FIG. 2E, FIG. 2F, FIG. 2G and FIG. 2H are schematic views at one of various operations of manufacturing a stress monitoring device according to one or more embodiments of the present disclosure.

FIG. 2A, FIG. 2B, FIG. 2C, FIG. 2D, FIG. 2E, FIG. 2F, FIG. 2G and FIG. 2H are schematic views at one of various operations of manufacturing a stress monitoring device according to one or more embodiments of the present disclosure. As depicted in FIG. 2A, a substrate 10 is received. In some embodiments, the substrate 10 includes a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof. In some embodiments, structures or devices such as electronic structures or devices, semiconductor structures or devices, MEMS structures or devices or other structures or devices may be formed on or in the substrate 10.

In some embodiments, a buffer layer 12 is formed over the substrate 10. In some embodiments, the buffer layer 12 includes, but is not limited to, a dielectric layer or an insulative layer. In some embodiments, the buffer layer 12 at least partially covers the substrate 10, or structures or devices formed on or in the substrate 10 for protection. In some embodiments, a material of the buffer layer 12 includes silicon oxide, silicon nitride, silicon oxynitride or the like. In some embodiments, a thickness of the buffer layer 12 is equal to or larger than about 2000 angstroms, but not limited thereto.

Figure 2B:
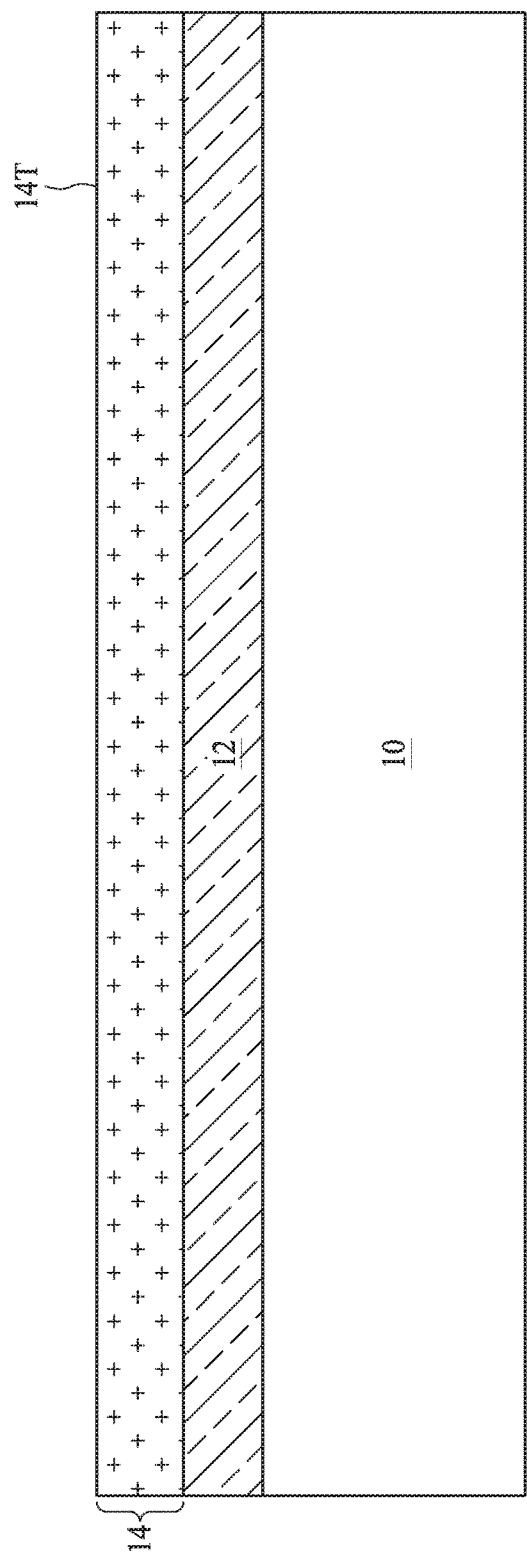

As depicted in FIG. 2B, a sacrificial layer 14 is formed over the substrate 10. The sacrificial layer 14 is configured as a temporary protection layer or release layer, and will be removed in part or in whole. In some embodiments, the material of the sacrificial layer 14 is different from the material of the buffer layer 12 such that the buffer layer 12 can be maintained when the sacrificial layer 14 is removed. In some embodiments, the material of the sacrificial layer 14 includes, but is not limited to, semiconductive material such as polycrystalline silicon or the like. In some embodiments, a thickness of the sacrificial layer 14 is equal to or larger than about 4000 angstroms e.g. 2 micrometers, but not limited thereto.

Figure 2C:
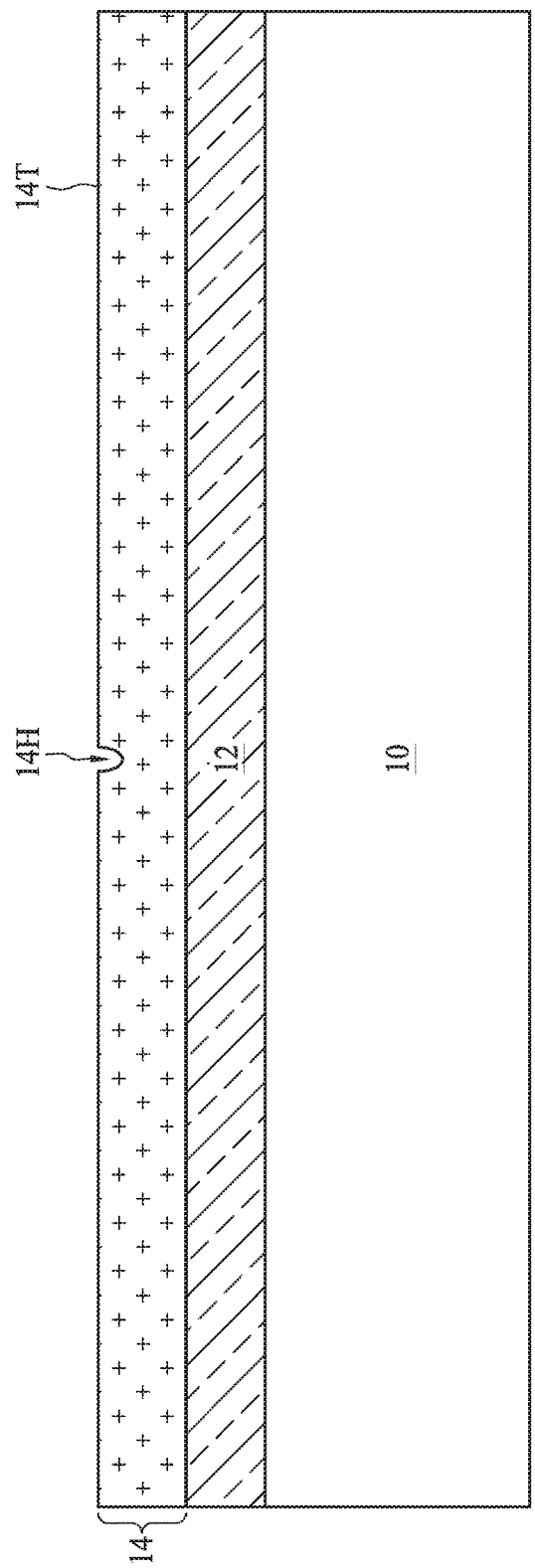

As depicted in FIG. 2C, in some embodiments, one or more dimples 14H recessed from a surface 14T of the sacrificial layer 14 can be formed. In some embodiments, the dimple(s) 14H can be formed e.g., by photolithography and etching techniques, but not limited thereto. In some embodiments, the dimple 14H is recessed from the surface 14T of the sacrificial layer 14, but not through the sacrificial layer 14.

Figure 2D:
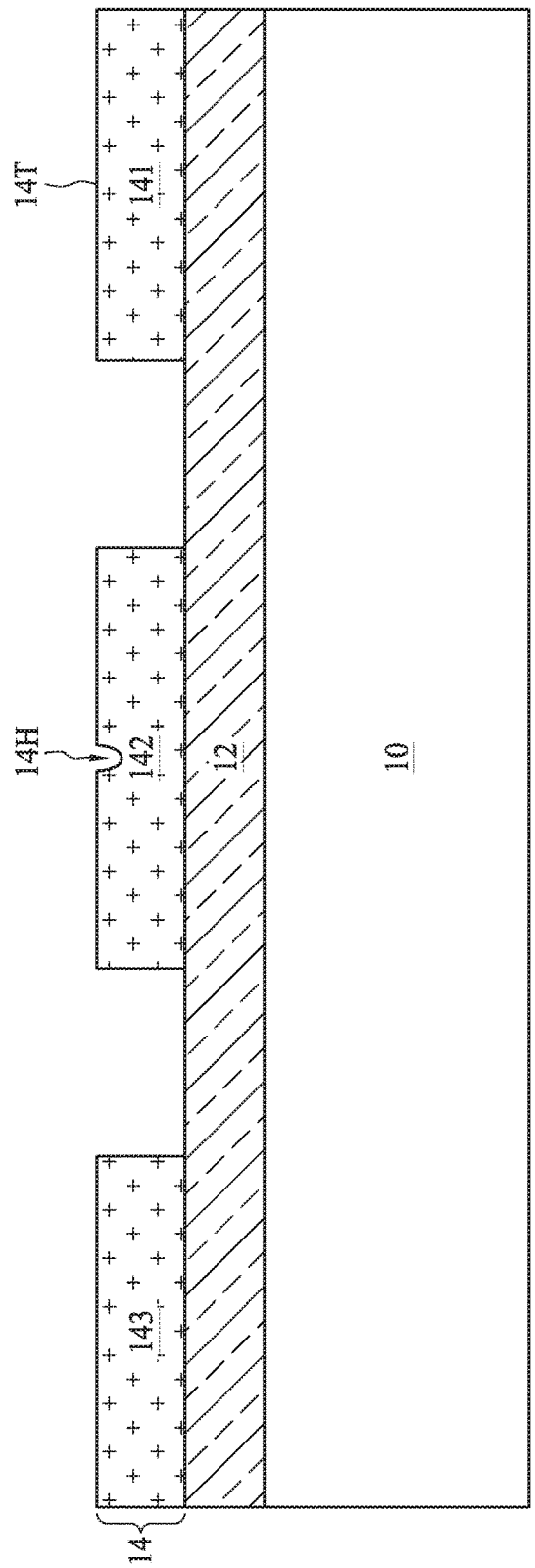

As depicted in FIG. 2D, the sacrificial layer 14 is patterned to form a first portion 141, a second portion 142 and a third portion 143. In some embodiments, the sacrificial layer 14 is patterned e.g., by photolithography and etching techniques, but not limited thereto. In some embodiments, the first portion 141, the second portion 142 and the third portion 143 can be connected or separated. For example, the first portion 141 may be separated from the second portion 142 and the third portion 143, but not limited thereto. In some embodiments, the one or more dimples 14H are located in the second portion 142 after the sacrificial layer 14 is patterned. In some embodiments, the etch rate of the sacrificial layer 14 is higher than the etch rate of the buffer layer 12, and thus the buffer layer 12 can be reserved during patterning the sacrificial layer 14 to protect the substrate 10 or the structures or devices formed in or on the substrate 10 from being damaged. In some embodiments, a ratio of the etch rate of the sacrificial layer 14 to the etch rate of the buffer layer 12 may be higher than about 10 with respect to an etchant, but not limited thereto.

Figure 2E:
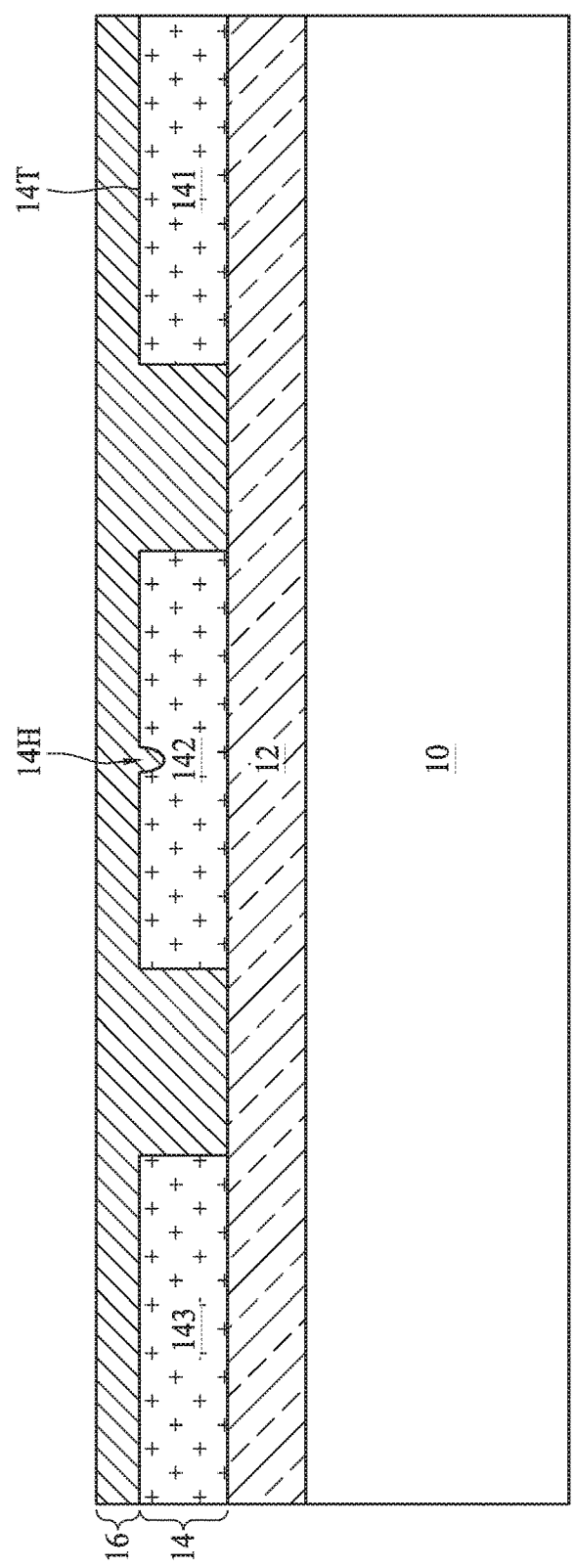

As depicted in FIG. 2E, a structural layer 16 is formed over the first portion 141, the second portion 142 and the third portion 143 of the patterned sacrificial layer 14. The material of the structural layer 16 is different from the material of the sacrificial layer 14 such that the structural layer 16 can be maintained when removing the sacrificial layer 14. The material of the structural layer 16 may include, but is not limited to, a dielectric material, a conductive material such as metal, an insulative material, or any other suitable material different from that of the sacrificial layer 14. In some embodiments, the structural layer 16 is further formed in the one or more dimples 14H of the sacrificial layer 14. In some embodiments, the structural layer 16 is single-layered. In some embodiments, the structural layer 16 may be multi-layered.

Figure 2F:
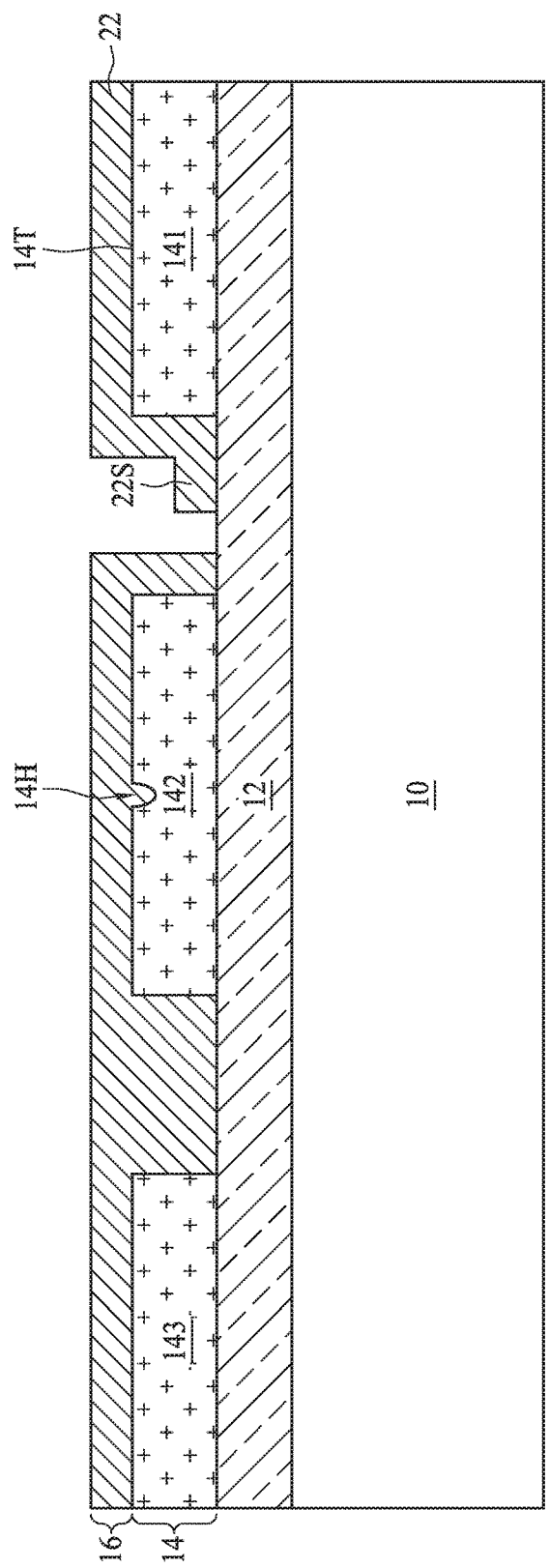

As depicted in FIG. 2F, the structural layer 16 is patterned to form a Vernier structure 22 having scales 22S (also shown in FIG. 3) protruding out from the first portion 141 of the sacrificial layer 14. In some embodiments, the first portion 141, the second portion 142 and the third portion 143 of the sacrificial layer 14 are enclosed by the structural layer 16 after the scales 22S are formed. In some embodiments, the structural layer 16 is patterned e.g., by photolithography and etching techniques, but not limited thereto.

Figure 2G:
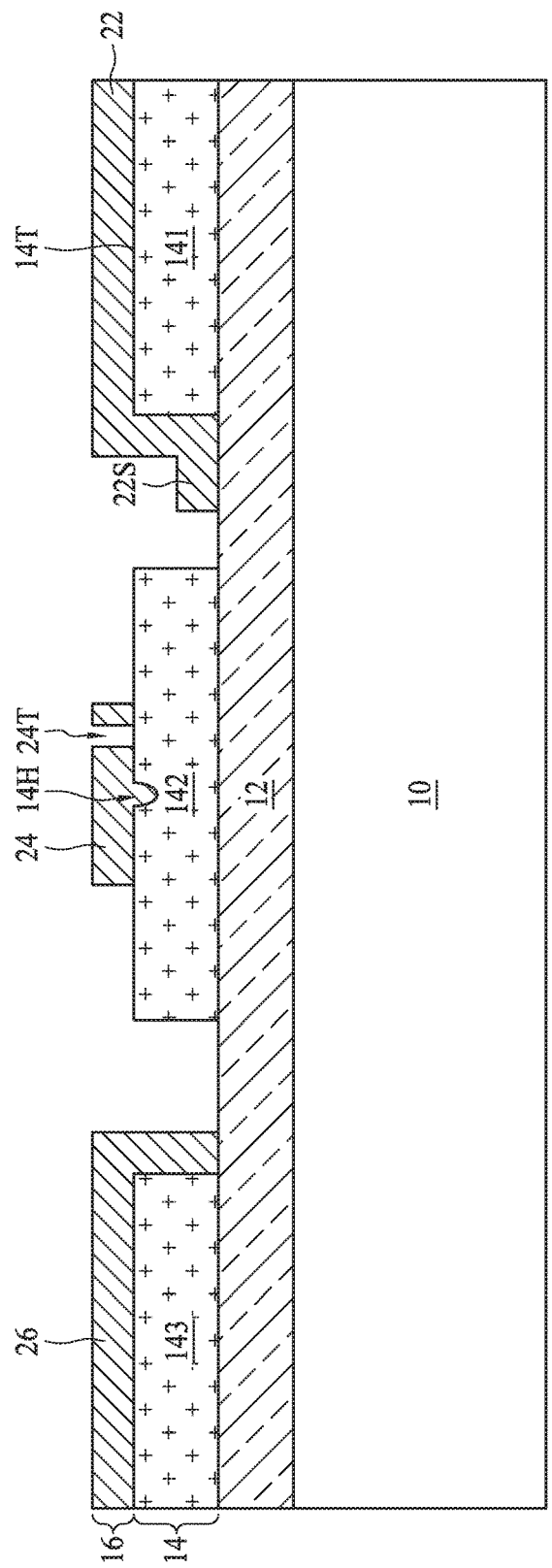

As depicted in FIG. 2G, the structural layer 16 is patterned again to form a freestanding structure 24 over the second portion 142 and to form an anchor structure 26 over the third portion 143. In some embodiments, the freestanding structure 24 exposes a portion of the second portion 142. In some embodiments, one or more edges of the second portion 142 are exposed. In some embodiments, the anchor structure 26 encloses the third portion 143. In some embodiments, the structural layer 16 is patterned e.g., by photolithography and etching techniques, but not limited thereto. In some embodiments, the structural layer 16 may be patterned to form through openings 24T to expose a portion of the second portion 142 of the sacrificial layer 14. The shape, dimension and spacing of the through openings 24T may be configured based on the dimension of the freestanding structure 24 or other considerations as exemplarily disclosed in some embodiments of FIG. 4 or FIG. 5, but not limited thereto.

Figure 2H:
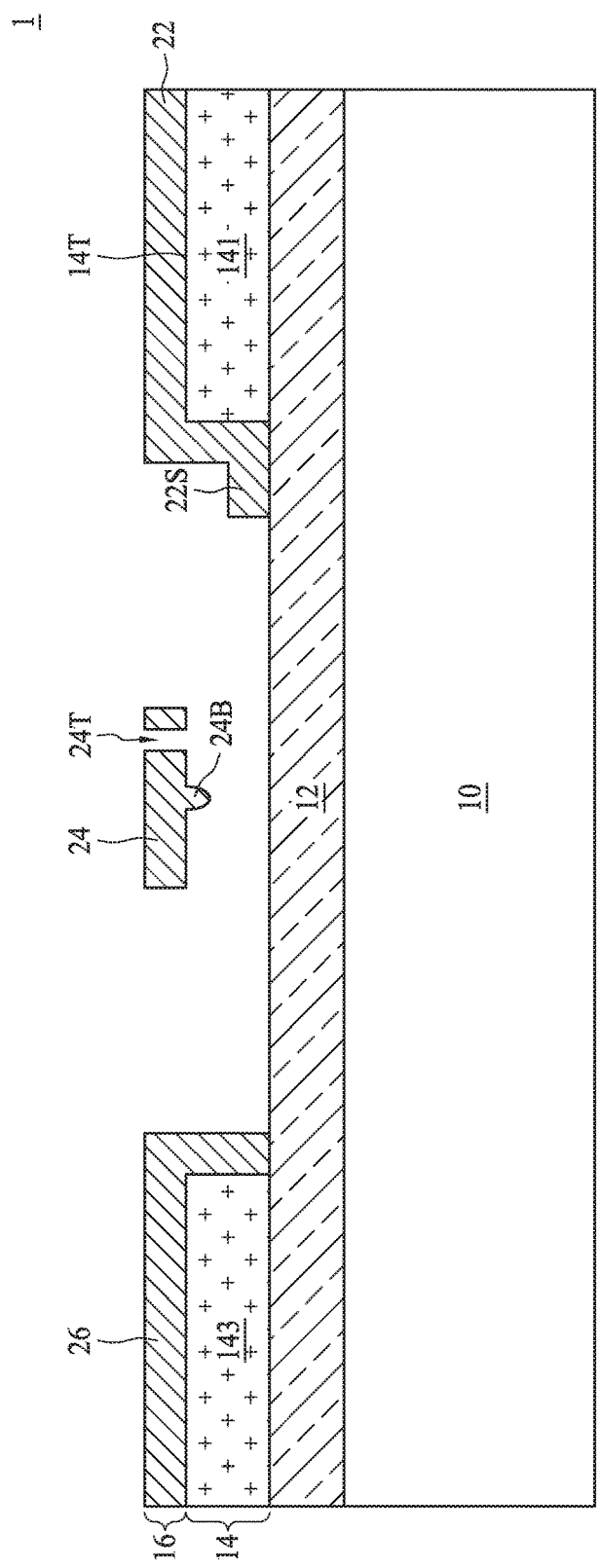

As depicted in FIG. 2H, the second portion 142 of the sacrificial layer 14 exposed from the freestanding structure 24 is removed such that the freestanding structure 24 is suspended and free from the substrate 10, while the Vernier structure 22 and the anchor structure 26 are supported by the first portion 141 and the third portion 143 of the sacrificial layer 14, respectively. In some embodiments, the first portion 141 and the third portion 143 of the sacrificial layer 14 are enclosed by the structural layer 16, and thus can be maintained when removing the second portion 142. In some embodiments, the second portion 142 of the sacrificial layer 14 is removed by etching such as vapor etching, but not limited thereto. By way of example, the sacrificial layer 14 is removed by $XeF_2$ vapor etching. In some embodiments, an etch rate of the sacrificial layer 14 is higher than an etch rate of the structural layer 16 with respect to an etchant such that the structural layer 16 can be undamaged. By way of example, a ratio of the etch rate of the sacrificial layer 14 to the etch rate of the structural layer 16 may be higher than about 10 with respect to an etchant, but not limited thereto. In some embodiments, the structural layer 16 located in the one or more dimples 14H of the sacrificial layer 14 forms one or more bumps 24B after the second portion 142 of the sacrificial layer 14 is removed. The one or more bumps 24B protrude out from the freestanding structure 24 toward the substrate 10 or the buffer layer 12. In some embodiments, the one or more bumps 24B are configured to prevent the freestanding structure 24 from sticking to the substrate 10 or to the buffer layer 12 after removing the sacrificial layer. In some embodiments, the through openings 24T of the structural layer 16 help to remove the second portion 142 of the sacrificial layer 14 more thoroughly. Accordingly, a stress monitoring device 1 of some embodiments of the present disclosure is fabricated.

Figure 3:
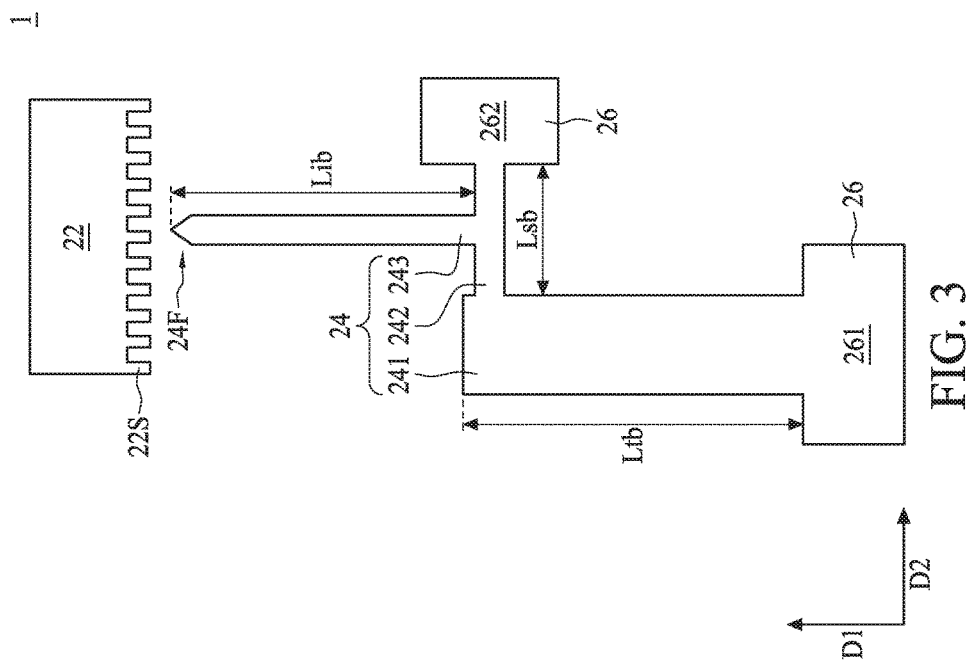
FIG. 3 is a schematic top view of a stress monitoring device according to one or more embodiments of the present disclosure.

FIG. 3 is a schematic top view of a stress monitoring device according to one or more embodiments of the present disclosure. Referring to FIG. 3 and FIG. 2H, the stress monitoring device 1 includes an anchor structure 26, a freestanding structure 24 and a Vernier structure 22. The freestanding structure 24 is connected to the anchor structure 26, and includes a free end 24F suspended from the substrate 10. The Vernier structure 22 is adjacent to the free end 24F of the freestanding structure 24, and the Vernier structure 22 includes scales 22S configured to measure a displacement of the free end 24F of the freestanding structure 24. In some embodiments, the anchor structure 26 includes a first anchor 261 and a second anchor 262 over the substrate 10. In some embodiments, the first anchor 261 and the second anchor 262 are separated from each other. In some embodiments, the freestanding structure 24 includes one or more beams. In some embodiments, the freestanding structure 24 includes a test beam 241, a slope beam 242 and an indicator beam 243. In some embodiments, the test beam 241 is connected to the first anchor 261. For example, the test beam 241 is connected to the first anchor 261 and extending along a first direction D1. In some embodiments, the slope beam 242 is connected to the second anchor 262 and the test beam 241. In some embodiments, the slope beam 242 is connected to the second anchor 262 at one end, extended along a second direction D2, and connected to the test beam 241 at the other end. In some embodiments, the second direction D2 is substantially perpendicularly to the first direction D1, but not limited thereto. The indicator beam 243 is connected to the slope beam 242. In some embodiments, the indicator beam 243 is connected to the slope beam 242 at one end, and extended along the first direction D1. In some embodiments, the indicator beam 243 includes the free end 24F suspended from the substrate 10. In some embodiments, the free end 24F of the indicator beam 243 points at the scales 22S of the Vernier structure 22 and can be movable in response to local stress along the second direction D2 relative to the scales 22S of the Vernier structure 22. In some embodiments, the free end 24F of the indicator beam 243 moves to the left in response to a tensile stress, and moves to the right in response to a compressive stress.

In some embodiments, a stress of the stress monitoring device 1 can be measured by an equation:

$$\sigma = 2/3 * (E/1-v)(Lsb/Lib*Ltb)*\delta, \text{ where}$$

σ denotes stress of the stress monitoring device;

E denotes modulus of elasticity a material of the freestanding structure;

v denotes Poisson ratio of the material of the freestanding structure;

Lsb denotes length of the slope beam;

Lib denotes length of the indicator beam;

Ltb denotes length of the test beam; and

δ denotes displacement of the free end measured by the Vernier structure.

In some embodiments, the stress monitoring device 1 is configured to detect a local stress of a patterned structural layer 16 that forms the freestanding structure 24 and other structures or devices during fabrication. The stress monitoring device 1 is formed from the structural layer 16, and thus can monitor the stress of the structural layer 16 in real-time. For example, after the structural layer 16 is patterned, or thermally treated, the stress monitoring device 1 is responsive to the stress change as well and thus can real-time monitor stress changes. The stress monitoring device 1 can be formed at any positions of the substrate 10. In some embodiments, the stress monitoring device 1 can be formed in some or each chip (cell) of the substrate 10 to collect stress distribution throughout the substrate 10, and the stress distribution data can be helpful to modify manufacturing parameters, to alleviate wafer warpage, to avoid pealing or cracking issues, or the like. In some embodiments, two or more stress monitoring devices 1 may be oriented in different directions for monitoring stresses in different directions.

The stress monitoring device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
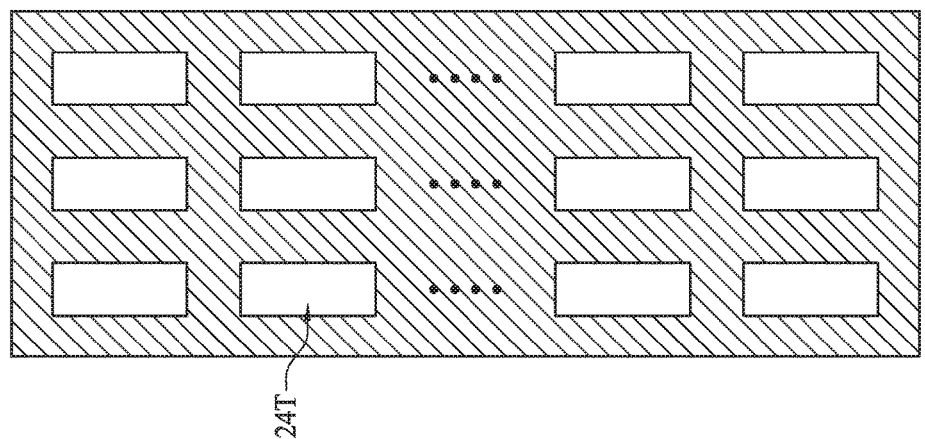
FIG. 4 is a schematic partial top view of a freestanding structure according to one or more embodiments of the present disclosure.

FIG. 4 is a schematic partial top view of a freestanding structure according to one or more embodiments of the present disclosure. Referring to FIG. 4 and FIG. 2G, FIG. 2H and FIG. 3, the partial top view may illustrate any part of the freestanding structure 24 such as the test beam 241, the slope beam 242, the indicator beam 243 or a combination thereof. In some embodiments, the freestanding structure 24 includes through openings 24T penetrating the structural layer 16 and exposing the second portion 142 of the sacrificial layer 14. In some embodiments, the through openings 24T are configured to help to remove the second portion 142 of the sacrificial layer 14 more thoroughly, as discussed previously. The shape, dimension and spacing of the through openings 24T may be configured based on the dimension of the freestanding structure 24 or other considerations. In some embodiments, the length of a beam such as the test beam 241 is about 500 micrometers, but not limited thereto. In some embodiments, the shape and the dimension of the through openings 24T may be substantially the same. In some embodiments, the through opening 24T includes a slot shape, with a length of about 10 micrometers and a width of about 3 micrometers, but not limited thereto. In some embodiments, a spacing between two adjacent through openings 24T in a length direction is about 5 micrometers, and a spacing between two adjacent through openings 24T in a width direction is about 5.25 micrometers, but not limited thereto.

Figure 5:
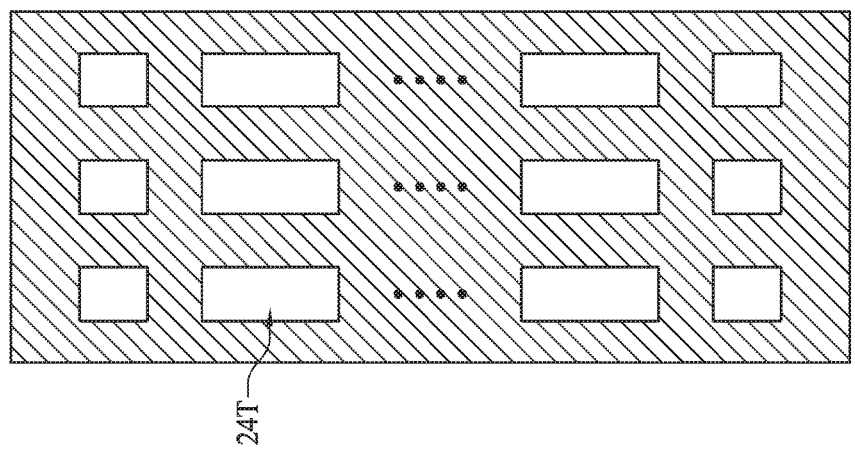
FIG. 5 is a schematic partial top view of a freestanding structure according to one or more embodiments of the present disclosure.

FIG. 5 is a schematic partial top view of a freestanding structure according to one or more embodiments of the present disclosure. Referring to FIG. 5 and FIG. 2G, FIG. 2H and FIG. 3, in some embodiments, the length of a beam such as the test beam 241 is about 750 micrometers or 1500 micrometers, but not limited thereto. The through openings 24T may include different dimensions. In some embodiments, a portion of the through openings 24T has smaller dimension, while another portion of the through openings 24T has larger dimension. In some embodiments, a portion of the through openings 24T adjacent to edge of the freestanding structure 24 includes a smaller slot shape, which a length of about 5 micrometers, and a width of about 3 micrometers. In some embodiments, another portion of the through openings 24T adjacent to middle of the freestanding structure 24 includes a larger slot shape, which a length of about 10 micrometers, and a width of about 3 micrometers. In some embodiments, a spacing between two adjacent through openings 24T in a length direction is about 5 micrometers, and a spacing between two adjacent through openings 24T in a width direction is about 5.25 micrometers, but not limited thereto.

Figure 6:
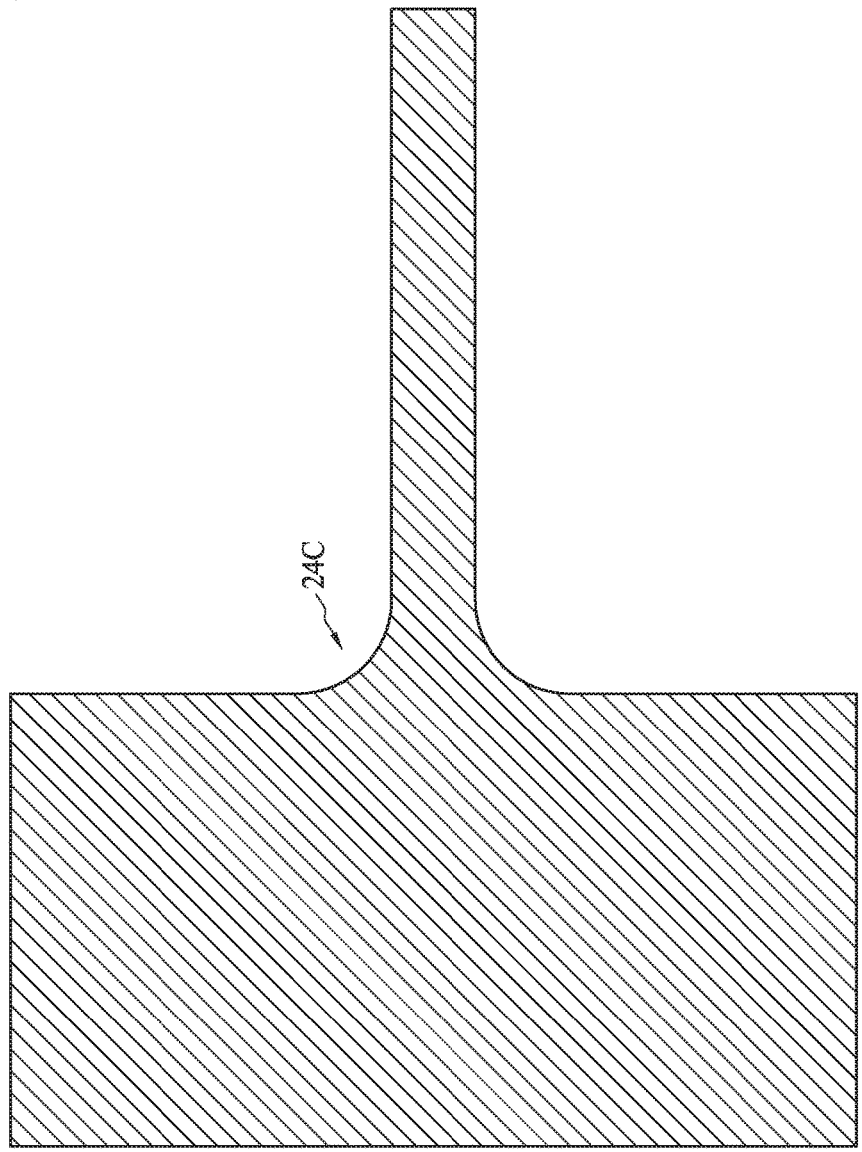
FIG. 6 is a schematic partial top view of a freestanding structure according to one or more embodiments of the present disclosure.

FIG. 6 is a schematic partial top view of a freestanding structure according to one or more embodiments of the present disclosure. Referring to FIG. 6 with reference to FIG. 2G, FIG. 2H and FIG. 3, a connection 24C between different portions of the freestanding structure 24 may has a rounding corner. In some embodiments, at least one of a connection 24C between the test beam 241 and the slope beam 242 has a rounding corner and a connection 24C between the slope beam 242 and the indicator beam 243 has a rounding corner. In some embodiments, the rounding corner is configured to avoid local stress concentration, and alleviate cracking.

Figure 7:
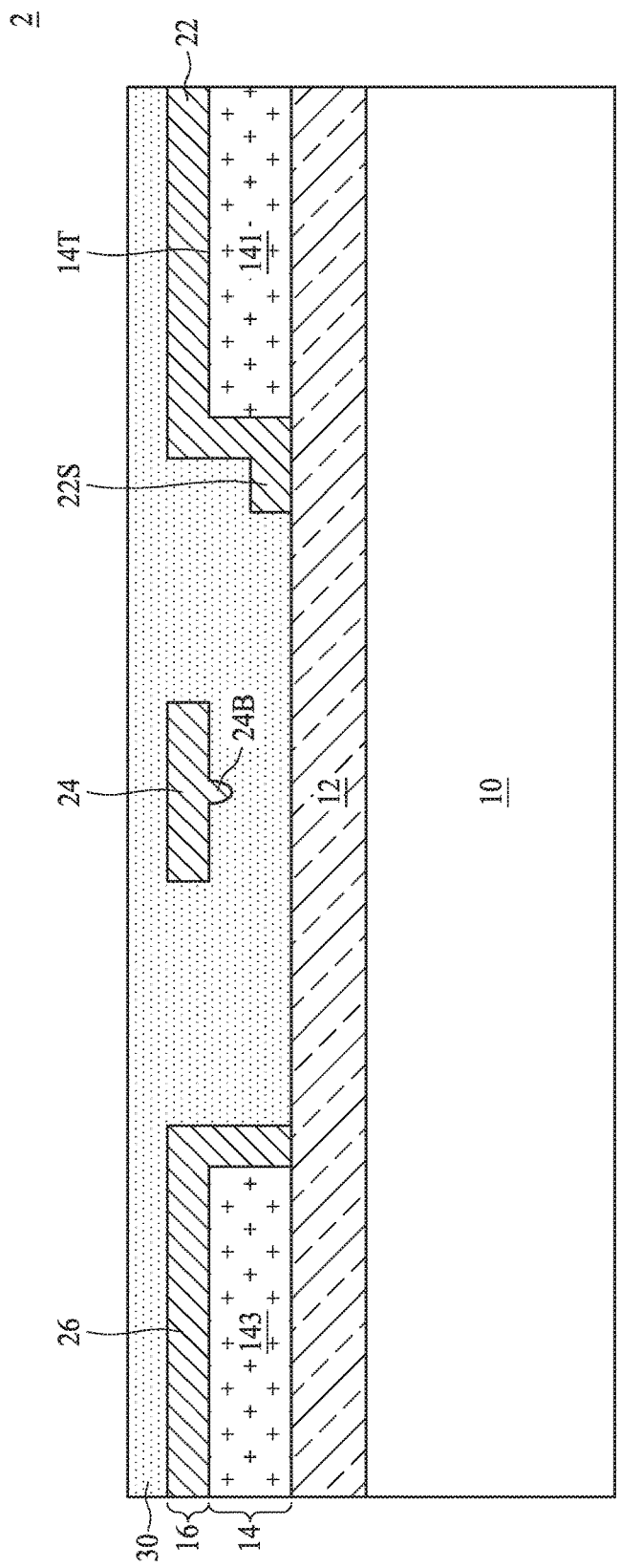
FIG. 7 is a schematic cross-sectional view of a stress monitoring device according to one or more embodiments of the present disclosure.

FIG. 7 is a schematic cross-sectional view of a stress monitoring device according to one or more embodiments of the present disclosure. As shown in FIG. 7, different from the stress monitoring device 1 of FIGS. 2-3, the stress monitoring device 2 of some embodiments further include at least one overlying layer 30 covering the freestanding structure 24. In some embodiments, the at least one overlying layer 30 may further cover the anchor structure 26 and/or the Vernier structure 26. In some embodiments, the at least one overlying layer 30 may partially or entirely constrain the freestanding structure 24 from moving. In some embodiments, the stress data during fabrication has been obtained, and thus the freestanding structure 24 can be covered and constrained by the at least one overlying layer 30. In some embodiments, the at least one overlying layer 30 may cover a portion of the freestanding structure 24. In some embodiments, the at least one overlying layer 30 may enclose the freestanding structure 24. In some embodiments, the material of the at least one overlying layer 30 may include insulative material, conductive material, semiconductor material, or a combination thereof. In some embodiments, although the freestanding structure 24 may be constrained by the at least one overlying layer 30 from moving, the stress monitoring device 2 may have been used to detect stress during fabrication before the at least one overlying layer 30 is formed.

In some embodiments of the present disclosure, the stress monitoring device is configured to detect a local stress of a patterned structural layer. The stress monitoring device is formed from the structural layer, and thus can monitor the stress of the structural layer in real-time. For example, after the structural layer is patterned, thermally treated or undergone other treatment, the stress monitoring device is responsive to the stress change and thus can real-time monitor stress changes. The stress monitoring device can be formed at any positions of the substrate. In some embodiments, the stress monitoring device can be formed in some or each chip (cell) of the substrate to collect stress distribution throughout the substrate and the stress distribution data can be helpful to modify manufacturing parameters, to alleviate wafer warpage, to avoid peeling or cracking issues, or the like. In some embodiments, two or more stress monitoring devices may be oriented in different directions for monitoring stresses in different directions.

In one exemplary aspect, a stress monitoring device includes an anchor structure, a freestanding structure and a Vernier structure. The anchor structure is over a substrate. The freestanding structure is over the substrate, wherein the freestanding structure is connected to the anchor structure and includes a free end over the substrate. The Vernier structure is over the substrate and adjacent to the free end of the freestanding structure, wherein the Vernier structure comprises scales configured to measure a displacement of the free end of the freestanding structure.

In another aspect, a stress monitoring device includes a first anchor, a second anchor, a freestanding structure and a Vernier structure. The first anchor and the second anchor are over the substrate. The freestanding structure is over the substrate, wherein the freestanding structure includes a test beam, a slope beam and an indicator beam. The test beam is connected to the first anchor at one end. The slope beam is connected to the second anchor at one end, and connected to the test beam at the other end. The indicator beam is connected to the slope beam at one end, and extending along the first direction, wherein the indicator beam includes a free end suspended from the substrate. The Vernier structure is over the substrate, wherein the Vernier structure includes scales facing the free end of the indicator beam and configured to measure a displacement of the free end of the freestanding structure.

In yet another aspect, a method for manufacturing a stress monitoring device is provided. A substrate is provided. An anchor structure, a freestanding structure and a Vernier structure are formed over the substrate. The freestanding structure is connected to the anchor structure and includes a free end suspended from the substrate. The Vernier structure is adjacent to the free end of the freestanding structure. The Vernier structure includes scales configured to measure a displacement of the free end of the freestanding structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A stress monitoring device, comprising:
an anchor structure over a substrate;
a freestanding structure over the substrate, wherein the freestanding structure is connected to the anchor structure and includes a free end over the substrate;
at least one overlying layer constraining the freestanding structure from moving; and
a Vernier structure over the substrate and adjacent to the free end of the freestanding structure, wherein the Vernier structure comprises scales configured to measure a displacement of the free end of the freestanding structure.

2. The stress monitoring device of claim 1, further comprising a buffer layer between the substrate and the freestanding structure.

3. The stress monitoring device of claim 1, further comprising one or more bumps protruding from the freestanding structure toward the substrate.

4. The stress monitoring device of claim 1, wherein the freestanding structure comprises at least one beam, and the at least one beam includes the free end pointing at the scales of the Vernier structure.

5. The stress monitoring device of claim 1, wherein the freestanding structure includes a plurality of through openings.

6. A stress monitoring device, comprising:
a first anchor and a second anchor over the substrate;
a freestanding structure over the substrate, wherein the freestanding structure comprises:
a test beam connected to the first anchor at one end;
a slope beam connected to the second anchor at one end, and connected to the test beam at the other end; and
an indicator beam connected to the slope beam at one end, and extending along the first direction, wherein the indicator beam includes a free end suspended from the substrate; and
a Vernier structure over the substrate, wherein the Vernier structure comprises scales facing the free end of the indicator beam and configured to measure a displacement of the free end of the freestanding structure.

7. The stress monitoring device of claim 6, further comprising a buffer layer between the substrate and the freestanding structure.

8. The stress monitoring device of claim 6, further comprising one or more bumps protruding out from the freestanding structure toward the substrate.

9. The stress monitoring device of claim 6, wherein at least one of a connection between the test beam and the slope beam has a rounding corner and a connection between the slope beam and the indicator beam has a rounding corner.

10. The stress monitoring device of claim 6, wherein at least one of the test beam, the slope beam and the indicator beam includes a plurality of through openings.

11. The stress monitoring device of claim 6, wherein the test beam is extended along a first direction, the slope beam is extended along a second direction, and the indicator beam is extended along the first direction.

12. The stress monitoring device of claim 6, wherein a stress of the stress monitoring device is measured by an equation:

$$\sigma = 2/3 * (E/1-v)(Lsb/Lib*Ltb)*\delta, \text{ where}$$

σ denotes a stress of the stress monitoring device;
E denotes a modulus of elasticity a material of the freestanding structure;
v denotes a Poisson ratio of the material of the freestanding structure;
Lsb denotes a length of the slope beam;
Lib denotes a length of the indicator beam;
Ltb denotes a length of the test beam; and
δ denotes a displacement of the free end measured by the Vernier structure.

13. The stress monitoring device of claim 6, further comprising at least one overlying layer constraining the freestanding structure from moving.

14. A stress monitoring device, comprising:
a pointing structure having at least one fixed end anchored over a substrate, and a pointing end opposite to the at least one fixed end and apart from the substrate;

one or more bumps protruding from the pointing structure toward the substrate; and a Vernier structure over the substrate, wherein the Vernier structure comprises scales facing the pointing end of the pointing structure.

15. The stress monitoring device of claim 14, further comprising a buffer layer between the substrate and the pointing structure, apart from the pointing structure.

16. The stress monitoring device of claim 14, wherein the pointing structure comprises at least one beam connected between the at least one fixed end and the pointing end.

17. The stress monitoring device of claim 14, wherein a material of the pointing structure comprises a dielectric material.

18. The stress monitoring device of claim 1, wherein a material of the pointing structure comprises a conductive material.

19. The stress monitoring device of claim 1, wherein a material of the freestanding structure comprises a dielectric material.

20. The stress monitoring device of claim 1, wherein a material of the freestanding structure comprises a conductive material.

* * * * *